(12) United States Patent
Von Koblinski et al.

(10) Patent No.: US 8,546,934 B2
(45) Date of Patent: Oct. 1, 2013

(54) METHOD FOR MANUFACTURING SEMICONDUCTOR DEVICES HAVING A GLASS SUBSTRATE

(75) Inventors: Carsten Von Koblinski, Bodensdorf (AT); Gerald Lackner, Arnoldstein (AT); Karin Schrettlinger, Trebesing (AT); Markus Ottowitz, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/495,603

(22) Filed: Jun. 13, 2012

(65) Prior Publication Data

US 2012/0248631 A1 Oct. 4, 2012

Related U.S. Application Data

(62) Division of application No. 12/837,155, filed on Jul. 15, 2010, now Pat. No. 8,202,786.

(51) Int. Cl.
*H01L 23/12* (2006.01)
*H01L 23/06* (2006.01)

(52) U.S. Cl.
USPC ............. 257/704; 257/729; 257/E23.009; 257/E23.192

(58) Field of Classification Search
None
See application file for complete search history.

(56) References Cited

U.S. PATENT DOCUMENTS

| 4,235,645 A | 11/1980 | Johnson | |
|---|---|---|---|
| 5,259,737 A * | 11/1993 | Kamisuki et al. | 417/322 |
| 5,798,557 A | 8/1998 | Salatino et al. | |
| 5,825,092 A | 10/1998 | Delgado et al. | |
| 6,146,917 A | 11/2000 | Zhang et al. | |
| 6,391,742 B2 | 5/2002 | Kawai | |
| 6,630,725 B1 | 10/2003 | Kuo et al. | |
| 6,835,588 B2 * | 12/2004 | An et al. | 438/48 |
| 7,098,117 B2 * | 8/2006 | Najafi et al. | 438/456 |
| 7,138,335 B2 | 11/2006 | Toyoda et al. | |
| 7,204,737 B2 * | 4/2007 | Ding et al. | 445/24 |
| 7,393,758 B2 | 7/2008 | Sridhar et al. | |
| 7,408,257 B2 | 8/2008 | Jung et al. | |
| 7,419,840 B2 | 9/2008 | Omori | |
| 7,622,324 B2 | 11/2009 | Enquist et al. | |
| 7,867,807 B2 * | 1/2011 | Kishita et al. | 438/64 |

(Continued)

FOREIGN PATENT DOCUMENTS

| JP | 10-098121 | * | 4/1998 |
| JP | 2007-158212 | * | 6/2007 |

OTHER PUBLICATIONS

Notice of Allowance mailed Feb. 22, 2012 in U.S. Appl. No. 12/837,155.

*Primary Examiner* — Scott B Geyer
(74) *Attorney, Agent, or Firm* — Dicke, Billig & Czaja, PLLC

(57) ABSTRACT

A method for manufacturing semiconductor devices is disclosed. A semiconductor wafer is provided having a first surface and a second surface opposite to the first surface. A first glass substrate is provided which has at least one of cavities and openings at the bonding surface. The first glass substrate is bonded to the first surface of the semiconductor wafer such that the metal pads are arranged within respective cavities or openings of the first glass substrate. The second surface of the semiconductor wafer is machined. At least one metallisation region is formed on the machined second surface of the semiconductor wafer.

3 Claims, 10 Drawing Sheets

(56) References Cited

U.S. PATENT DOCUMENTS

| | | |
|---|---|---|
| 8,012,850 B2 | 9/2011 | Kojima et al. |
| 2006/0160273 A1 | 7/2006 | Chen |
| 2008/0217743 A1 | 9/2008 | Kojima et al. |
| 2010/0117176 A1 | 5/2010 | Uekawa |
| 2010/0201221 A1 | 8/2010 | Inoue et al. |
| 2010/0207697 A1 | 8/2010 | Sayama |
| 2011/0018112 A1 | 1/2011 | Ogura et al. |

* cited by examiner

METHOD FOR MANUFACTURING SEMICONDUCTOR DEVICES HAVING A GLASS SUBSTRATE

CROSS-REFERENCE TO RELATED APPLICATIONS

This Utility patent application is a divisional application of U.S. application Ser. No. 12/837,155, filed Jul. 15, 2010, which is incorporated herein by reference.

BACKGROUND

This description refers to embodiments of semiconductor devices having a glass substrate. Hereinafter are also described embodiments of methods for manufacturing semiconductor devices having a glass substrate. One or more embodiments relate to power semiconductor devices.

In order to improve the device characteristics of semiconductor devices attempts have been made to reduce the final thickness of semiconductor material, particularly for power semiconductor devices. It is desired that the semiconductor chip of such devices has a thickness which is just sufficient for accommodating the device or circuit.

The manufacturing and handling of thin semiconductor chips and wafers is complicated since the brittle semiconductor material, once thinned, is prone to breaking. To improve the mechanical stability of thinned semiconductor material, carrier systems have been developed which can be classified as reversible and irreversible carrier systems.

Irreversible carrier systems include a carrier which is irreversibly attached to the semiconductor material. Reversible carrier systems include a carrier which is reversibly connected to the semiconductor material, i.e. the chip can be detached from the carrier without being damaged so that the carrier will not be a part of the finished semiconductor device. Irrespectively which carrier system is used, it will be subjected to, at least to some extent, various processes together with the semiconductor material. Some of the processes are carried out at high temperatures. The bond connection between the carrier and the semiconductor material must withstand such high temperatures.

Reversible carrier systems typically include bond connections which can tolerate only moderate temperatures, for example up to 250° C. for a short time. Irreversible carrier systems can withstand higher temperatures.

Commonly known carrier systems, however, merely mechanically support the fragile semiconductor material and facilitate the handling. Furthermore, when forming thick metallisation regions on thin semiconductor substrates, the substrates may be deformed by the thick metallisation.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
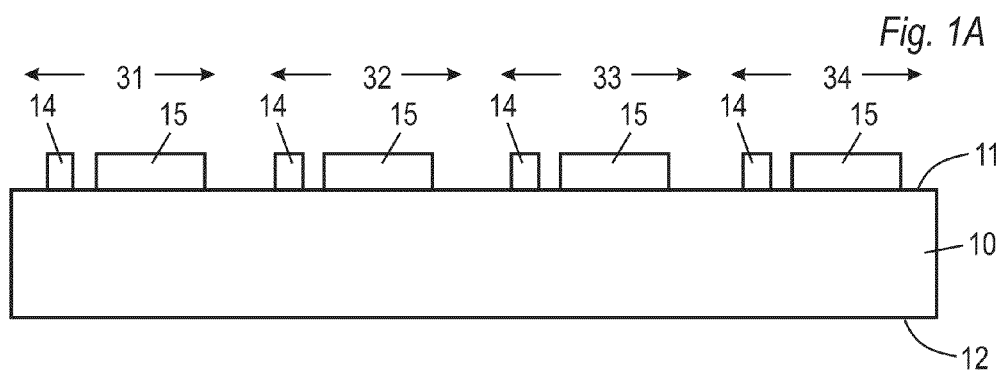
FIGS. 1A to 1E illustrate processes of a method for manufacturing semiconductor devices according to one embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The term "semiconductor component" as used in this specification intends to describe a semiconductor device which is at least partially processed in and on the semiconductor wafer. Partially processed means that the semiconductor device is not fully completed and that further processes such as formation of doping regions, contact regions and metallisation, and dicing are needed to obtain an operable semiconductor device.

The semiconductor device is at least a two-terminal device, an example is a diode. The semiconductor device can also be a three-terminal device such as a field-effect transistor (FET), insulated gate bipolar transistor (IGBT), junction field effect transistors (JFET), and thyristors to name few. The semiconductor device can also include more than three terminals.

Specific embodiments described herein pertain to, without being limited thereto, power semiconductor devices and particularly to devices which are controlled by field-effect.

According to one or more embodiments, a method for manufacturing semiconductor devices is provided. A semiconductor wafer is provided having a first surface and a second surface opposite to the first surface, wherein the semiconductor wafer includes a plurality of doping regions and metal pads, which are arranged on or at the first surface. A first glass substrate is provided which has a bonding surface and at least one of cavities and openings at the bonding surface. The first glass substrate is bonded with its bonding surface to the first surface of the semiconductor wafer such that the metal pads are arranged within respective cavities or openings of the first glass substrate. The second surface of the semiconductor wafer is machined to reduce the thickness of the semiconductor wafer. At least one metallisation region is formed on the machined second surface of the semiconductor wafer, and the semiconductor wafer and the first glass substrate are diced to obtain separate semiconductor devices.

According to one or more embodiments, a method for manufacturing semiconductor devices is provided. A semiconductor wafer and a glass substrate are provided. Trenches are formed in the glass substrate along pre-defined break lines. The glass substrate is bonded to the semiconductor wafer, and the semiconductor wafer and glass substrate are diced by breaking along the trenches.

Figure 2H:
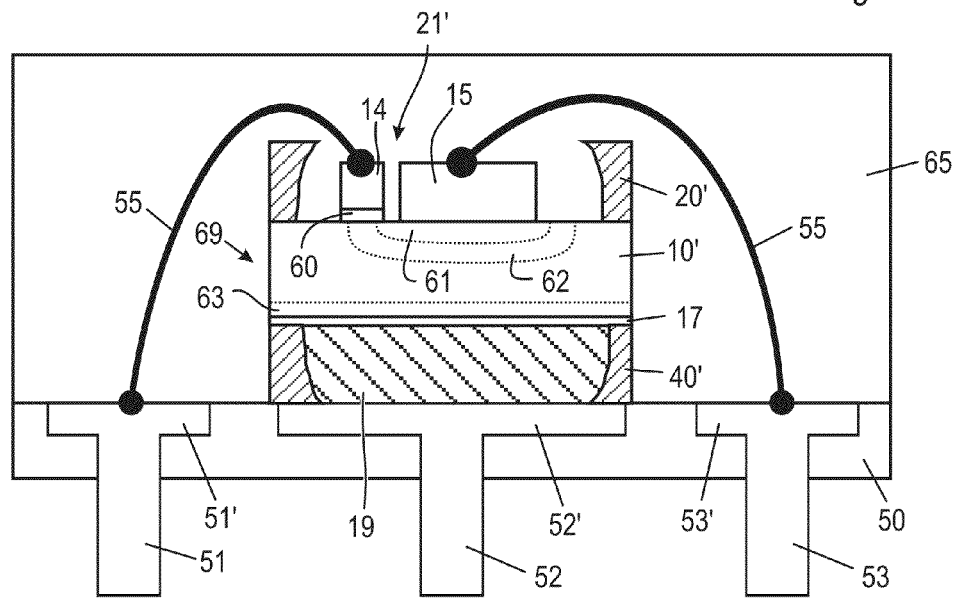
Figure 3:
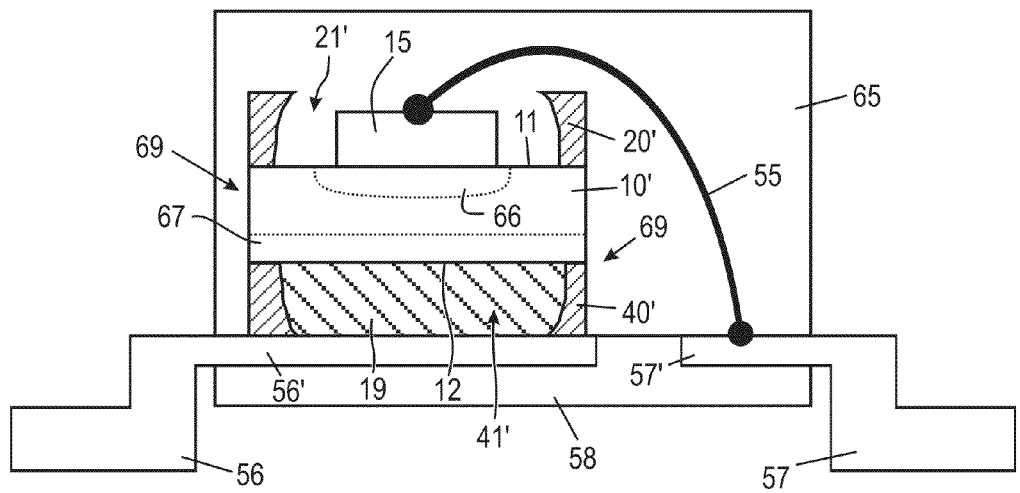
FIG. 3 illustrates a semiconductor device such as a power semiconductor device according to one embodiment.

With reference to FIGS. 1A to 1E, a first embodiment of a method for manufacturing semiconductor devices is described. A semiconductor wafer 10 is provided which includes a first surface 11 and a second surface 12 arranged opposite to the first surface 11. The semiconductor wafer 10 includes a plurality of doping regions which are not illustrated in FIG. 1A. FIGS. 2H and 3, which illustrate enlarged details of finished semiconductor devices, includes doping regions. The doping regions are for example formed at the first surface 11 and form, for example, anode regions of diodes. In case of a FET, the doping regions can be body regions and/or source regions.

The semiconductor substrate 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Metal pads 14, 15 are arranged on the first surface 11. Metal pad 14 can be, for example, a gate pad structure while metal pad 15 can be, for example, a source pad structure.

The semiconductor wafer 10 includes a plurality of commonly processed semiconductor components, i.e. not yet finished semiconductor devices. FIG. 1A exemplifies this by indicating several semiconductor components 31, 32, 33 and 34 formed in the semiconductor wafer 10. In this embodiment, each semiconductor component 31, 32, 33 and 34 includes one metal pad 14 and one metal pad 15. The metal pads 14, 15 can be comprised of the same metal or of different metals. Furthermore, the metal pads 14, 15 can be of different height and structure. For example, a metal pad used as source metallisation will typically be larger than a metal pad used as gate metallisation.

According to one or more embodiments, the processes for forming structures of the semiconductor components 31, 32, 33 and 34 at the first surface 11 are finished. This typically includes the formation of the metal pads 14, 15 which are later used as landing pads for bond wire connections.

According to one or more embodiments, the semiconductor components 31, 32, 33 and 34 can also be semi-finished. Typically, most of the structures including doping regions located at or near the first surface 11 have already been formed.

Figure 1B:
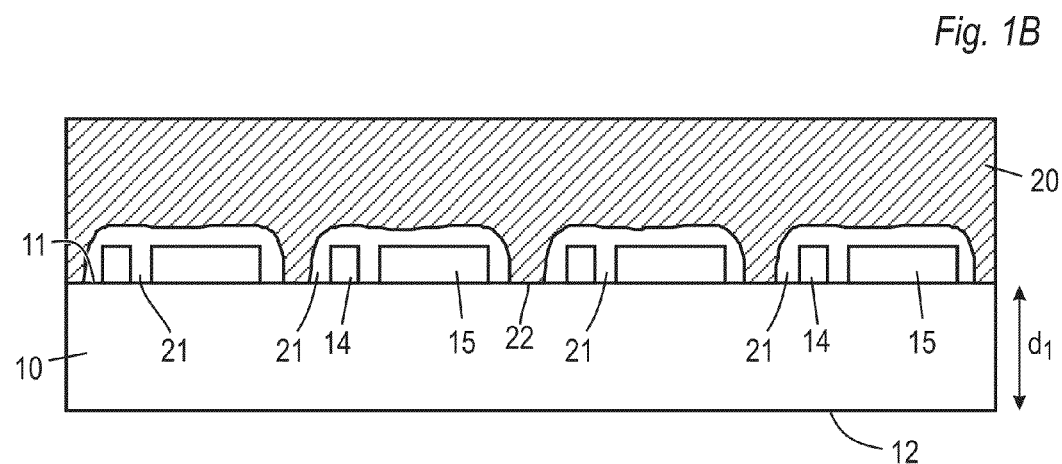

As illustrated in FIG. 1B, a first glass substrate 20 is provided which has a bonding surface 22. The first glass substrate 20 includes at least one of cavities and openings at the bonding surface. In the present embodiment, the first glass substrate 20 includes a plurality of cavities 21 formed at the bonding surface 22. In other embodiments, see for example FIGS. 5A to 5D, the glass substrate includes openings.

In this specification, cavities are only open to the bonding surface of the glass substrates while openings are open to the bonding surface of the glass substrates and to the surface opposite to the bonding surface. Hence, cavities are single-sided open while openings are double-sided open.

The size of cavities 21 is adapted to accommodate the metal pads 14, 15 of the respective semiconductor component 31, 32, 33 and 34. In this embodiment, each cavity 21 is sized to accommodate both metal pads 14, 15. In other embodiments, see for example FIGS. 6A and 6D, the cavities are sized to accommodate only one of the metal pads.

The first glass substrate 20 is bonded with its bonding surface 22 to the first surface 11 of the semiconductor wafer 20 such that the metal pads 14, 15 are arranged within respective cavities 21 of the first glass substrate 20.

Figure 1C:
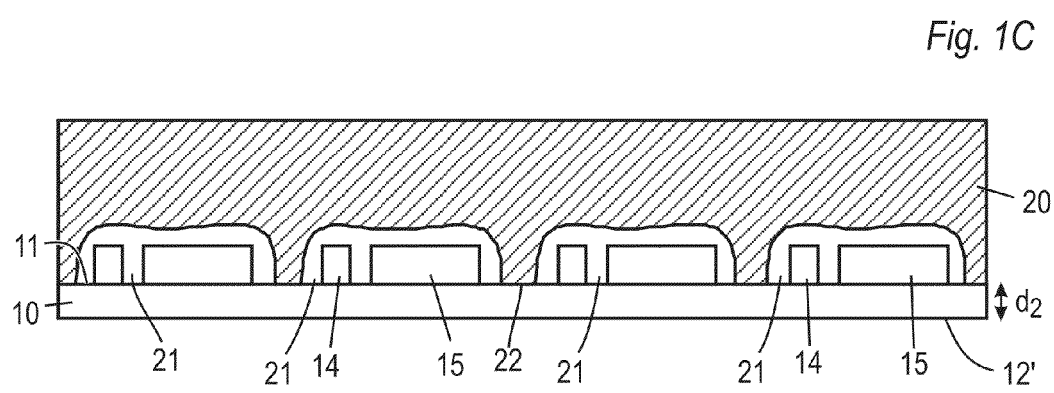

In a further process, as illustrated in FIG. 1C, the second surface 12 of the semiconductor wafer 10 is machined to reduce the thickness of the semiconductor wafer 10. Machining can include any suitable process to reduce the thickness of the semiconductor wafer 10. Examples are mechanical grinding, chemical-mechanical polishing, lapping and etching. Machining the second surface 12 of the semiconductor wafer 10 reduces the initial thickness $d_1$ of the semiconductor wafer 10 to a target thickness $d_2$ which is less than the initial thickness. Target thickness $d_2$ can be in a range from about 20 µm to about 100 µm. In one or more embodiments, target thickness $d_2$ can be from about 20 µm to about 50 µm.

Machining the second surface 12 of the semiconductor wafer 10 produces a machined second surface 12' as illustrated in FIG. 1C.

Figure 1D:
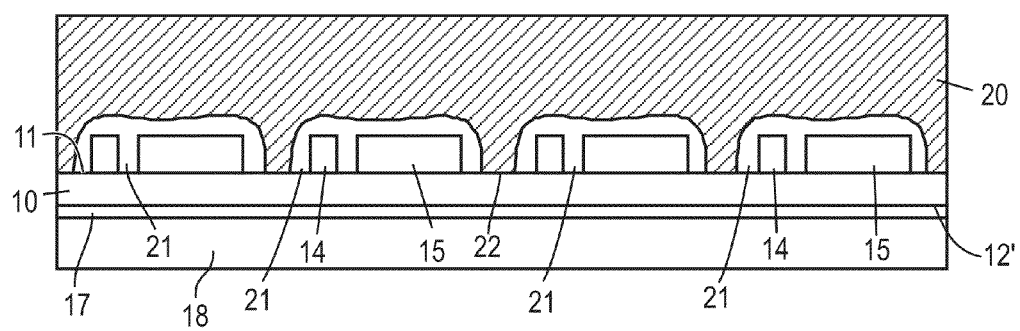

In a further process, which is illustrated in FIG. 1D, at least one metallisation region 17, 18 is formed on the machined second surface 12' of the semiconductor wafer 10. The formation of the metallisation region can include the formation of a thin metallic seed layer 17 and the subsequent formation of a thick metallic layer 18. Metallic seed layer 17 can be about 0.1 µm to about 2 µm thick while the metallic layer 18 can have a thickness of up to 100 µm. Metallic seed layer 17 can be formed by any suitable process such as metal sputtering or evaporation. Suitable materials for the metal seed layer 17 are silver (Ag), titanium (Ti) or aluminium (Al) to name a few.

The metallisation 18 can be formed, for example, by plating or printing. The seed layer 17 enables the metal plating on the machined second surface 12'. Virtually any type of metallisation can be formed on the machined second surface 12'.

Figure 1E:
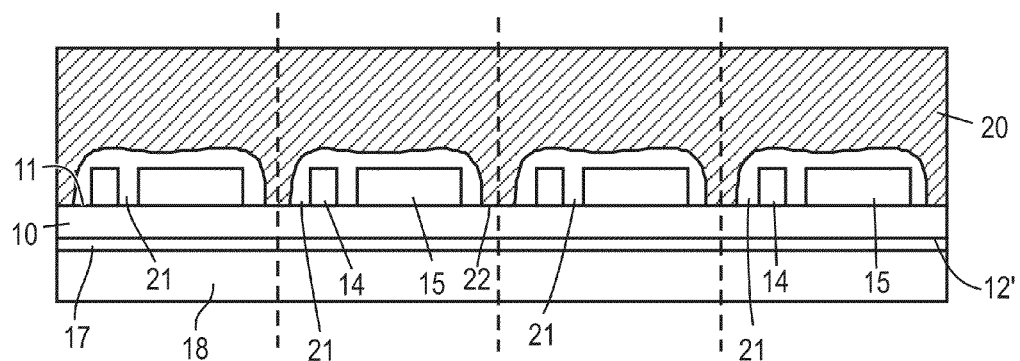

In a further process, as illustrated in FIG. 1E, the semiconductor wafer 10 is diced together with the first glass substrate 20 to obtain separate semiconductor devices. The separation lines along which the semiconductor wafer 10 and the glass substrate 20 are diced are illustrated in FIG. 1E by vertical dashed lines.

In connection with FIGS. 2A to 2H a more detailed process sequence according to one or more embodiments will be described below.

Figure 2A:
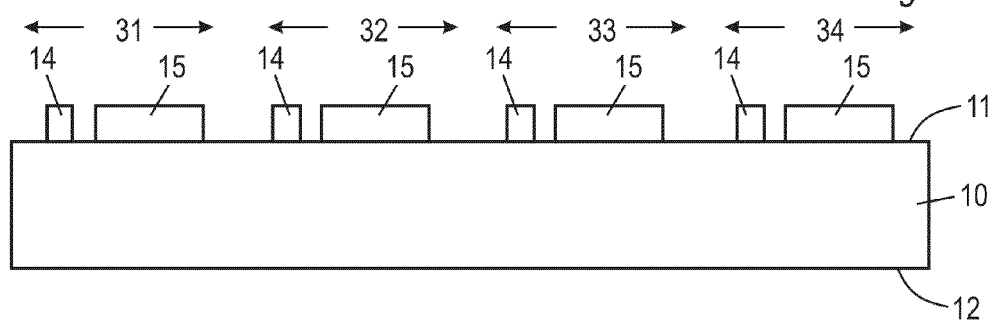
FIGS. 2A to 2H illustrate processes of a method for manufacturing semiconductor devices according to one embodiment.

Similar to the above described embodiment, a semiconductor wafer 10 having a first surface 11 and a second surface 12 is provided, as illustrated in FIG. 2A. Furthermore, a plurality of partially finished semiconductor devices, i.e., semiconductor components 31, 32, 33, 34 is formed in and on the semiconductor wafer 10, particularly at the first surface 11. Each of the semiconductor components 31, 32, 33, 34 includes at least one doping region and at least one metal pad 14, 15 arranged on the first surface 11 and in electrical contact with the doping region. Typically, the semiconductor components 31, 32, 33, 34 are of the same type. For example, all semiconductor components 31, 32, 33, 34 are power FETs, i.e. three-terminal devices.

In a further process, a pre-structured first glass substrate 20 is bonded with its bonding surface 22 to the first surface 11 of the semiconductor wafer 10. The first glass substrate 20 can be comprised of any suitable glass material such as pure quartz or any type of commercially available float glasses.

Cavities 21 are formed on the bonding surface 22 of the first glass substrate 20. The cavities 21 have respective sizes, i.e., depth and width, which are large enough to accommodate the structures of the semiconductor components 31, 32, 33, 34 formed on the first surface 11 of the semiconductor wafer 10.

The cavities 21 can be formed in advance by etching, for example. To this end, a mask defining the size and location of the cavities can be formed on the bonding surface 22. Any suitable etching process can be used, for example wet-chemical etching processes based on hydrofluoric acid (HF).

For bonding the first glass substrate 20 to the semiconductor wafer 10, any suitable bonding process can be employed. For example, anodic bonding can be used to bond the first glass substrate 20 directly on the semiconductor wafer 10.

When the first surface 21 of the semiconductor wafer 20 is covered, for example by a thin insulating layer, other bonding processes are more suitable. For example, glass-frit bonding provides reliable bond connections. Glass frit bonding uses a glass solder which has a melting temperature lower than that of the first glass substrate 20. The fusible glass solder is melted and provides an adhesive bond which can withstand temperatures of up to 500° C. A suitable glass solder is lead glass with a sufficiently high content of lead oxide to reduce the viscosity and melting temperature of the glass. The glass solder can be, for example, deposited as a thin glass layer on either the first glass substrate 20 or the semiconductor wafer 10 and pre-glazed. The semiconductor wafer 10 and the first glass substrate 20 are then brought into contact at the designed melting temperature of the glass solder. Pressure is also applied to keep the semiconductor wafer 10 and the first glass substrate 20 in intimate contact.

Another option is fusion bonding. Fusion bonding is performed by joining the semiconductor wafer 10 and the first glass substrate 20 together. To this end, the first surface 11 of the semiconductor wafer 10 and the bonding surface 22 of the first glass substrate 20 are made either hydrophobic or hydrophilic and then brought into contact and annealed at high temperatures.

Anodic bonding, glass-fit bonding and fusion bonding produces bond connections which can withstand very high temperatures of more than 500° C. Anodic bonding and fusion bonding usually produces bond connections which can tolerate even higher temperatures.

Adhesive bonding using a glass adhesive can also be applied. For example, silicate adhesives can be used which are commercially available, for example, from Dow Corning. Depending on the nature of the glass adhesive, the adhesive bond connection can withstand temperatures of up to 250° C. to 300° C. for a short time in an inert atmosphere. This is sufficient for many of the manufacturing processes to which the semiconductor wafer is subjected for finishing the semiconductor components.

The glass adhesives, and also the glass solder, can also be photo-structurable when structuring is desired.

Further options include formation of a diamond-like-carbon layer (DLC) on the semiconductor wafer 10 to facilitate anodic bonding.

Figure 2B:
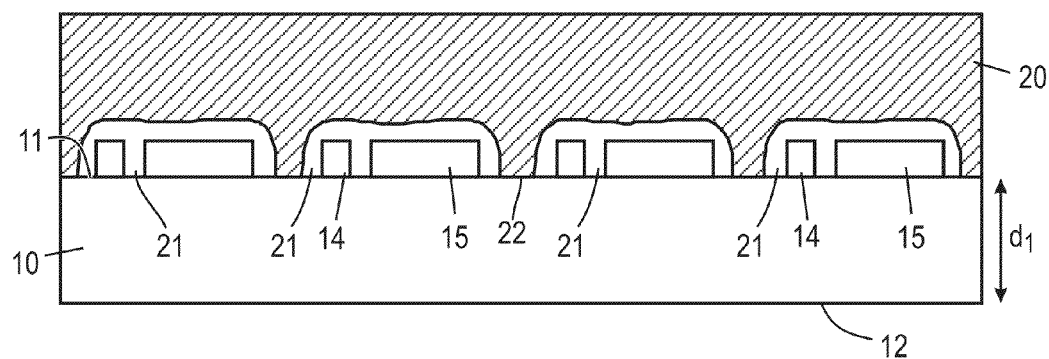

The resulting structure after bonding is illustrated in FIG. 2B.

After bonding the first glass substrate 20, the semiconductor wafer 10 is thinned to the target thickness $d_2$. The thinning process can include, without being limited thereto, grinding, etching and polishing of the second surface 12 to obtain a machined second surface 12'.

The structures of the semiconductor components 31, 32, 33, 34 on and at the first surface 11 are protected by the glass substrate 20 during thinning of the semiconductor wafer 20 since the cavities do no extend completely through the glass substrate 20. The structures of the semiconductor components 31, 32, 33, 34 are therefore sealed by the pre-structured glass substrate 20 during this processing.

In a further process, a thin metallic seed layer 17 is formed on the second surface 22 of the semiconductor wafer 20. The metallic seed layer 17 can be formed on the entire second surface 12. The metallic seed layer 17 is used for plating the metallisation in a later process. When other processes are used to form the metallisation, the metallic seed layer can be omitted. Furthermore, the seed layer 17 can also be formed, if needed, at a later stage. The thickness of the metallic seed layer 17 can be selected according to specific needs. It is also possible to provide the metallic seed layer 17 with a varying thickness. The material of the metallic seed layer 17 can be, for example silver (Ag), titanium (Ti) or aluminium (Al).

A pre-structured second glass substrate 40 having a plurality of cavities 41 formed at a bonding surface 42 is provided. The cavities 41 are sized to be smaller than the size of the final semiconductor device. The embodiment of FIGS. 2A to 2H illustrates cavities 41 which have a size similar to that of the cavities 21 of the first glass substrate 20.

Figure 2C:
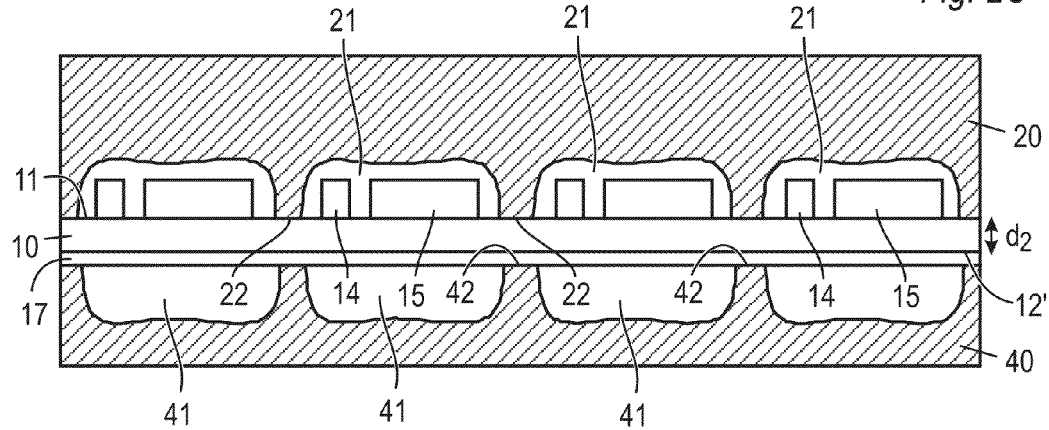

The second glass substrate 40 is bonded, with its bonding surface 42, to the semiconductor substrate 10 at its second surface 12'. When the second surface 12' of the semiconductor substrate 10 is covered by the thin metallic seed layer 17, the second glass substrate 40 is bonded using glass-frit bonding or adhesive bonding as described above. When no metallic seed layer 17 is used, any type of the above described bonding processes can be used. The resulting structure is illustrated in FIG. 2C.

To obtain sufficient bond strength, the contact area between the respective glass substrates 20, 40 and the semiconductor wafer 10 should be large enough. Since the respective bonding surfaces 22, 42 of the glass substrates 20, 40 are structured, the contact area is also structured. For many applications, it is sufficient when the wall thickness between adjacent cavities is about 50 μm or more to provide contact region having a size of 50 μm and more.

The first and second glass substrate 20, 40 are aligned with the semiconductor wafer 10 before bonding so that the respective cavities 21, 41 are aligned with the respective semiconductor components 31, 32, 33, 34. Alignment structures arranged in peripheral areas of the respective glass substrates 20, 40 and the semiconductor wafer 10 facilitates the alignment.

Figure 2D:
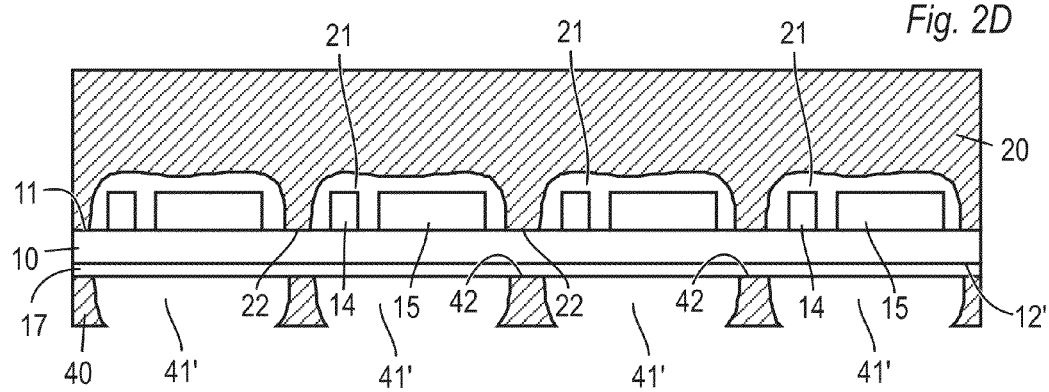

FIG. 2D illustrates a further process. The second glass substrate 40 is machined at its surface opposite to the bonding surface 42 to expose the cavities 41. Typically, the thickness of the second glass substrate 40 is reduced until the cavities 41 are exposed which than form openings 41' in the second glass substrate 40. The final thickness of the second glass substrate 40 can be selected according to specific needs. The machined second glass substrate 40 shall be thick enough to provide a sufficient mechanical stabilisation for the thin semiconductor wafer 10. The second glass substrate 10 can be grinded or polished or first grinded and then polished.

Figure 2E:
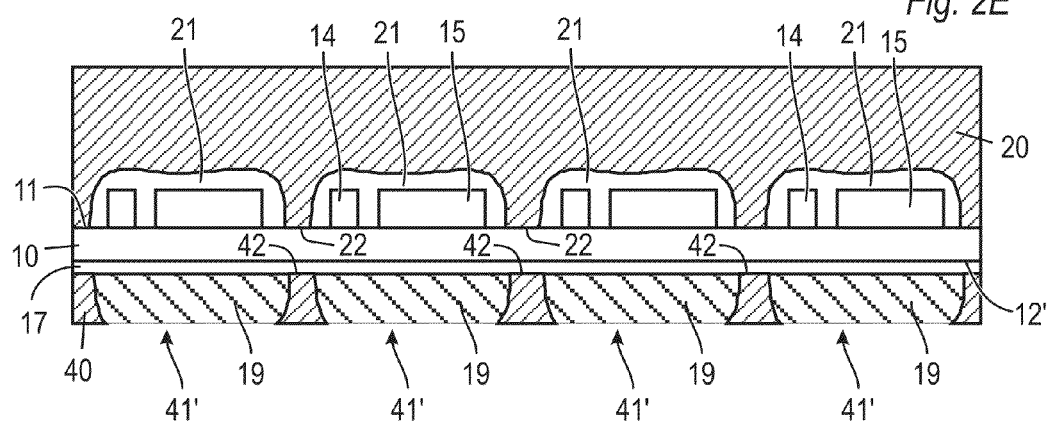

FIG. 2E illustrates processes for manufacturing metallisation regions on the second surface 22 of the semiconductor wafer 10. The machined second glass substrate 40 is used as a mask with the exposed cavities or openings 41' defining the size and location of the metallisation regions. In embodiments, each semiconductor component 31, 32, 33, 34 can be provided with one large metallisation region 19 which completely fills the opening 41'. By using the second glass substrate 40 as mask, a structured metallisation is formed with metallisation region 19 which are separated from each other.

Metallisation regions 19 can be formed, for example, by plating, printing or pasting. Typically, the exposed cavities or openings 41' are filled by a metal, metal compound or metal alloy. The metallic seed layer 17 formed on the entire second surface 12' of the semiconductor wafer facilitates plating which can be electroplating or electroless plating. Typically, copper is plated in a sufficient thickness to provide a good electrical connection and also a means for dissipating heat during operation of the semiconductor devices. Another option is printing or plating where a conductive past is brought onto the second glass substrate 20 and evenly distributed by a squeegee or doctor knife. The paste is then annealed to form conductive metallisation regions. The annealing temperature should be less than the temperature which the respective bond connection between the first and second glass substrates 20, 40 and the semiconductor wafer 10 can tolerate. Printing and pasting are cost efficient processes. Copper or a copper compound is typically used for printing or pasting due to the good electrical and thermal properties of copper.

In a further process, the first glass substrate 20 is machined to expose the cavities 21 and the metal pads 14, 15 arranged within the cavities 21. The resulting structure, illustrated in FIG. 2F, includes a first glass substrate 20 with a thickness less than the depth of the cavities 21 so that openings 21' are formed which laterally surrounds the metal pads 14, 15.

In one or more embodiments, the first and/or the second glass substrate 20, 40 provides a mechanical support for the semiconductor wafer 10 and form an irreversible carrier system. The glass substrate or glass substrates remain attached to the semiconductor wafer 10 and form an integral part of the final semiconductor devices. The final thickness of the glass substrate or glass substrates is not restricted to particular values and can be varied according to specific needs. The irreversible carrier system as described herein also allows handling of very thin semiconductor wafers 10. When the first and the second glass substrates 20, 40 are used, each glass substrate can be made comparably thin. Providing glass substrates on both sides of the semiconductor wafer also improves mechanical properties since a symmetrical support is formed.

Furthermore, the glass substrate or glass substrates can serve as device passivation. This allows omitting the commonly used polyimide-passivation. The glass passivation improves the electrical insulation due to the better dielectric characteristics of glass over polyimide.

The second glass substrate 40 provides a mask which allows structuring of the metallisation without the need of a further mask. This also facilitates the subsequent device separation as will be described below.

Figure 2F:
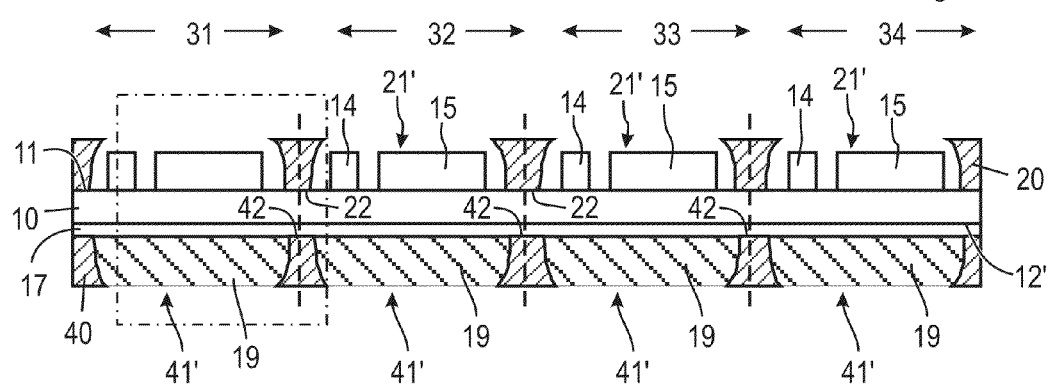

When separating the electronic components 31, 32, 33, 34 along separation lines indicated in FIG. 2F by dashed lines, the separation occurs through material having similar mechanical properties. FIG. 2F illustrates that the separation lines runs though the walls of the first and second glass substrates 20, 40 and also through the semiconductor wafer 10. The separation lines do not run through the thick portions of the metallisation, i.e. the metallisation regions 19 in this embodiment, and only through the optional thin metallic seed layer 17. The glass substrates 20, 40 and the semiconductor wafer 10 have similar mechanical properties as both materials are brittle. Different thereto, the thick metallisation is comprised of a ductile metal having mechanical properties different to that of the semiconductor wafer 10 and the glass substrates 20, 40. This difference in mechanical properties can cause difficulties during dicing, which difficulties can be reduced or avoided by the approach as described herein.

According to one or more embodiments, the back metallisation formed on the second surface 12' of the semiconductor wafer 10 is structured to have separate thick metal regions which are laterally spaced apart from each other. The space between the separate metallisation regions is used for dicing; hence the separation lines run along the spaces but not through the metallisation regions. This allows an even further increase of the thickness of the metallisation regions to improve thermal dissipation. The metallisation regions can have a thickness similar to the thickness of the glass substrate. For example, it is possible to provide up 100 μm thick or even thicker metallisation regions. The structuring of the metallisation on the second surface 12 of the semiconductor wafer 10 also reduces warping of the semiconductor wafer 10. As the separation does not go through the thick metallisation, the separation tools such as a saw are also not loaded with metal during separation which improves the separation process.

Dicing through the glass substrates 20, 40 and the semiconductor wafer 10 without dicing through the thick metallisation even allows separation by breaking. For dicing, any suitable dicing process can be used such as scribe-and-break, laser cutting and sawing. The optional thin metallic seed layer 17 does not significantly interfere with the above described dicing processes. When dicing the structure illustrated in FIG. 2F, separate semiconductor devices are formed each having a semiconductor chip 10', a first glass chip 20' and a second glass chip 40', respectively.

According to one or more embodiments, at least some or all walls of the glass substrates 20, 40 run along the separation lines between adjacent semiconductor components. Adjacent semiconductor components, which later form the semiconductor devices, are insulated from each other by walls of the respective glass substrate 20, 40.

Figure 2G:
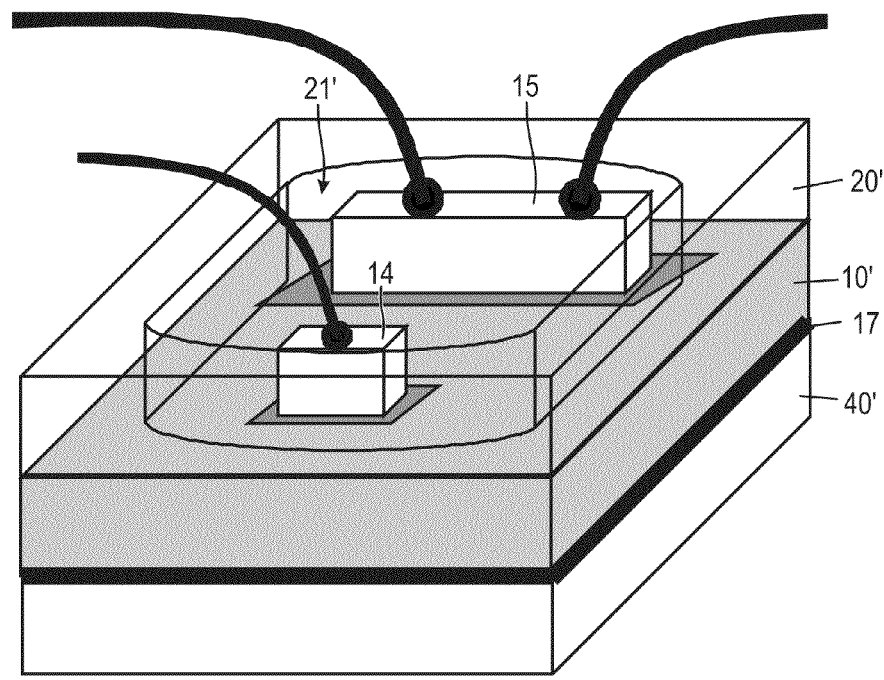

FIG. 2G illustrates a 3-dimensional view of a semiconductor device after dicing. There are also illustrated bond wire connections which will be formed at a later stage. As illustrated, metal pads 14 and 15 are completely laterally surrounded by first glass chip 20' having an exposed cavity or opening 21'. First and second glass chips 20', 40' have together with semiconductor chip 10' a common lateral separation surface 69 at which the metallic seed layer 17 is exposed when present. Hence, the lateral faces 69 of the semiconductor device are mainly formed by the semiconductor material of the semiconductor chip 10' and the glass material of the first and second glass chips 20', 40' but not by the thick metallisation region 19 which is not illustrated here.

FIG. 2H illustrates a final semiconductor device. The semiconductor device is attached to a carrier substrate 50 made of an insulating material. The carrier substrate 50 includes lead structures 51, 52, 53. Lead structures 51 and 53 include bonding pads 51' and 53' arranged on the upper side of the carrier substrate 50 while lead structure 52 includes a large pad 52' to which the semiconductor device is attached with its metallisation region 19 formed on the second surface of the semiconductor chip 10'. Electrical connection between metal pad 14 and bonding pad 51', and metal pad 15 and bonding pad 53', respectively, are provided by bond wires 55.

FIG. 2H also illustrates further structures of the semiconductor device. Metal pad 14 forms in this embodiment a gate electrode which in insulated from the semiconductor material of the chip 10' by a gate dielectric layer 60. Doping regions are also illustrated. 61 denotes a source region while 62 denotes a body region doped opposite to the source region 61 and to the semiconductor material of the chip 10'. A drain region 63 is formed at the second surface of the chip 10'. Drain region 63 is electrically connected to pad 52' through metallisation region 19 while source region 61 is electrically connected to metal pad 15.

Finally, the semiconductor device can be encapsulated in an insulating material 65 such as an epoxy resin to form a semiconductor module.

While FIG. 2H illustrates a three-terminal device such as a FET or an IGBT, FIG. 3 illustrates a two-terminal device such as a power diode according to one or more embodiments.

The semiconductor device includes at least two terminals which are formed in this embodiment by lead structures 56 and 57. These lead structures extend laterally from a carrier substrate 58. The semiconductor device further includes a semiconductor substrate formed in this embodiment by a semiconductor chip 10' having a first surface 11 and a second surface 12. The semiconductor chip 10' having at least one doping region 62 and a metal pad 15. Doping region 62 is formed at the first surface 11 and in electrical contact with metal pad 15 disposed on the first surface 11. Metal pad 15 forms in this embodiment the anode of a power diode. Doping region 62 is oppositely doped to the material of the semiconductor chip 10' which usually have a low n-doping concentration in case of power devices. A further doping region 63 is formed at the second surface 12 and is of the same doping type as the semiconductor material of the chip 10' but has a higher doping concentration.

A first glass substrate or glass chip 20' having at least one opening 21' is bonded to the first surface 11 of the semiconductor substrate 10' such that the metal pad 15 is arranged within the opening 21' of the first glass substrate 20'. A second glass substrate or glass chip 40' having at least one opening 41' is bonded to the second surface 12 of the semiconductor substrate 10'. At least one metallisation region 19 is disposed on the second surface 12 of the semiconductor substrate or semiconductor chip 10'. The metallisation region 19 fills the opening 41' of the second glass substrate 40' and provides an ohmic contact between the doping region 67 and a pad structure 56' of lead structure 56. Metallisation region 19 forms in this embodiment the cathode of the power diode. A metallic seed layer is not illustrated in this embodiment but can be provided if desired.

Metal pad 15 is electrically connected to a pad structure 57' of lead structure 57 by bond wire 55. The semiconductor device is encapsulated in an insulating material 65 such as an epoxy resin.

The semiconductor device has common lateral separation faces 69 formed by the first and second glass substrates 20' and 40' and the semiconductor substrate 10'.

Figure 4:
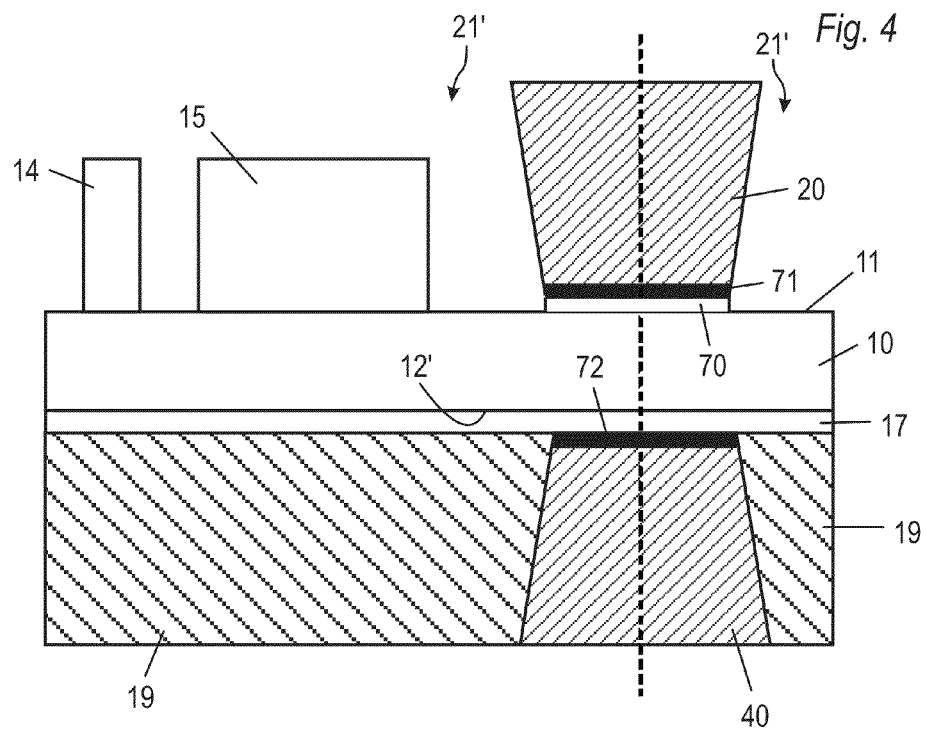
FIG. 4 illustrates an enlarged view of a detail of FIG. 2F.

FIG. 4 illustrates an enlarged detail from FIG. 2F indicated there by the dashed-dotted box. Semiconductor wafer 10 includes a thin oxide layer 70 disposed on the first surface 11. The first glass substrate 20 is bonded to that oxide layer 70 by adhesive bonding, which may employ photo-structurable adhesives 71, glass-fit bonding or fusion bonding. In one embodiment, oxide layer 70 can be replaced by a diamond-like-carbon layer. In this case, anodic bonding would also be possible.

Therefore, according to one or more embodiments, an oxide layer 70, or generally an insulating layer 70, is formed on the first surface 11 before bonding the first glass substrate 20.

Second glass substrate 40 is bonded on the thin metallic seed layer 17 by the semiconductor wafer 10 by adhesive bonding using a glass adhesive layer 72. The selected bonding process for the first and the second glass substrate 20, 40 depends on the characteristics of the surface to which the glass substrates are bonded. Since first and second surfaces 11, 12 of the semiconductor wafer 10 can be differently processed, the respective surfaces can exhibit different top layers and therefore different characteristics, so that different bonding processes will be used.

The bonding can include a thermal annealing process. When bonding the second glass substrate 40 to the semiconductor wafer, the annealing temperature should be adjusted to be within the thermal budget of the semiconductor components and also within the tolerable range of the bond connection between the semiconductor wafer 10 and the first glass substrate 20.

With respect to FIGS. 5A to 5D, a further embodiment is described. Structural features, which are similar to structural features described above, are denoted by the same reference numerals. Furthermore, the description of similar processes is omitted and corresponding references included.

Similar to the above described embodiments, a semiconductor wafer 10 having a first surface 11 and a second surface 12 is provided. The semiconductor wafer 10 includes a plurality of semiconductor components 31, 32, 33, 34 each of which includes at least one metal pad 14, 15 disposed on the first surface 11. The present embodiment illustrates two metal pads 14, 15 for each semiconductor component 31, 32, 33, 34. Furthermore, each semiconductor component 31, 32, 33, 34 includes at least one doping region.

Figure 5A:
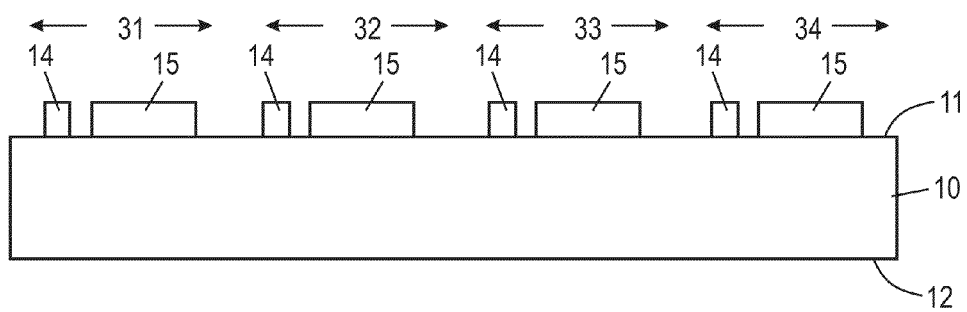
FIGS. 5A to 5D illustrate processes of a method for manufacturing semiconductor devices according to one embodiment.
Figure 5B:
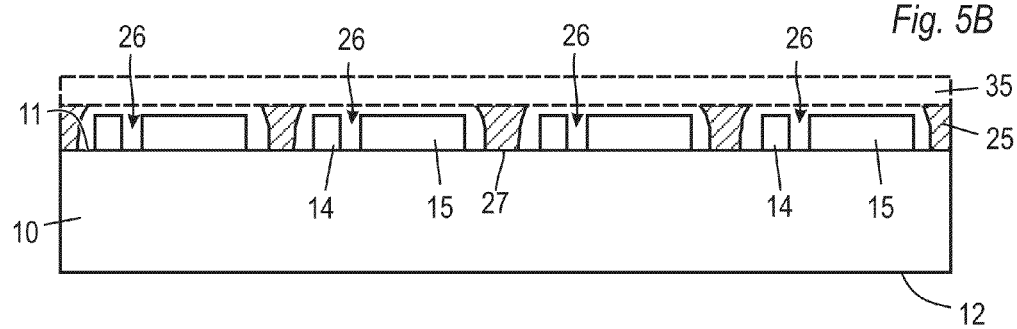

As illustrated in FIG. 5B, a pre-structured first glass substrate 25 having a plurality of openings 26 extending through the first glass substrate 25 is provided. The first glass substrate 25 includes a bonding surface 27. The openings 26 can be formed in advance by suitable processes such as etching. The size of the openings 26 are adapted to allow accommodation of the metal pads 14, 15 as described below.

The first glass substrate 25 is bonded with its bonding surface 27 to the first surface 11 of the semiconductor wafer 10 such that the metal pads 14, 15 of one semiconductor component 31, 32, 33, 34 are arranged within one opening 26 of the first glass substrate 25. For alignment purposes, alignment marks arranged on the semiconductor wafer 10 and the first glass substrate are used. The first glass substrate 25 can be bonded to the semiconductor wafer 10 by any of the above described bonding processes.

The first glass substrate 25 has a thickness which corresponds to the height of the metal pads 14, 15 or is larger than the height of the metal pads. Subsequently, the openings 26 of the first glass substrate 25 can be covered by an optional foil 35 to protect the semiconductor components 31, 32, 33, 34 and the structures arranged on the first surface 11 of the semiconductor wafer 10 during subsequent processes.

In a further process, the semiconductor substrate 10 is thinned as described above to a target thickness $d_2$. The semiconductor substrate 10 has then a processed second surface 12'. As described above, a thin metallic seed layer 17 is formed on the entire machined second surface 12'.

Figure 5C:
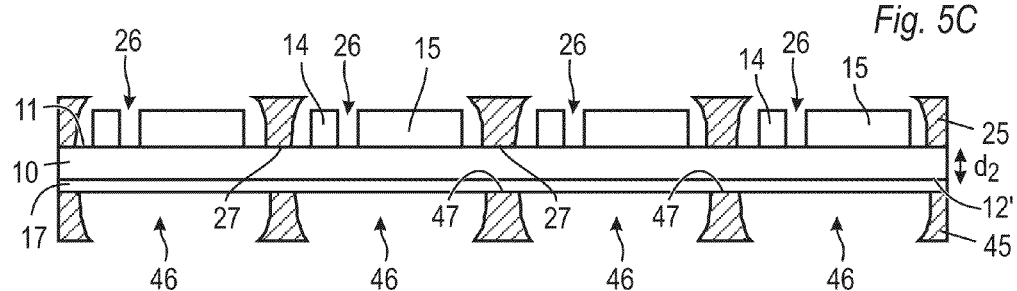
Figure 5D:
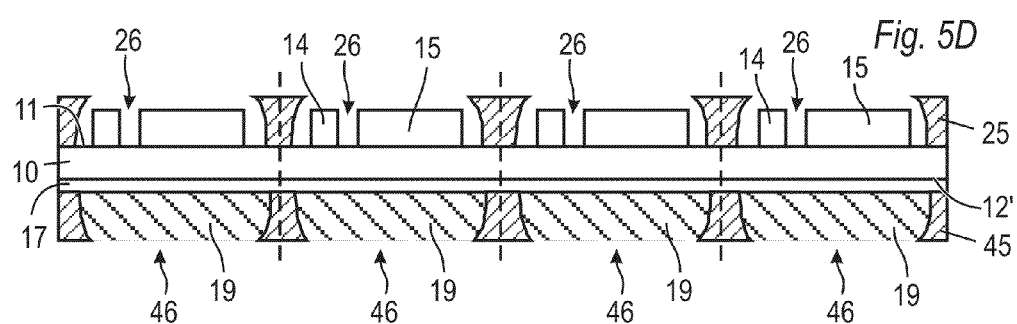

A second glass substrate 45 is provided having a plurality of openings 46 extending through the second glass substrate 45. The second glass substrate 45 has a bonding surface 47 with which the second glass substrate 45 is bonded onto the semiconductor wafer 10, particularly to the metallic seed layer 17, by any of the above described suitable bonding processes. First and second glass substrate 25, 45 are aligned with each other. The foil 35 can be removed at this or at a later stage. The resulting structure is illustrated in FIG. 5C.

In a further process, respective metallisation regions 19 are formed in the openings 46 as described above by any suitable process such as plating, pasting or printing. Subsequently, the semiconductor wafer 10 is diced along the predefined separation lines which are indicated by dashed lines in FIG. 5D. As described above, the separation occurs through the semiconductor wafer 10 and the walls of the respective glass substrates 25, 45 but not through the thick metallisation regions 19.

The embodiment illustrated in FIGS. 5A to 5D differs from the embodiments described above in that the pre-structured glass substrates 25, 45 include openings 26, 46. Processes for thinning the glass substrates 25, 45 are not required, but can be performed if needed.

It is also possible to combine processes from different embodiments. For example, a glass substrate 20 having cavities 21 as described further above can be used as first glass substrate and bonded to the semiconductor wafer 10. As second glass substrate, a glass substrate 45 having openings 46 can be used and bonded to the machined second surface 12' of the semiconductor wafer 10. In this variation, the structures at the first surface 11 of the semiconductor wafer 10 are protected by the first glass substrate 20 when thinning the semiconductor wafer 10 since the cavities 21 are not yet exposed. Furthermore, since the first glass substrate 20 is considerably thick, it stabilises the thinned semiconductor wafer 10 to a larger degree. The first glass substrate 20 can be machined, for example, after forming the metallisation regions 19 on the machined second surface 12' to expose the structures of the semiconductor components, particularly the metal pads.

Figure 6A:
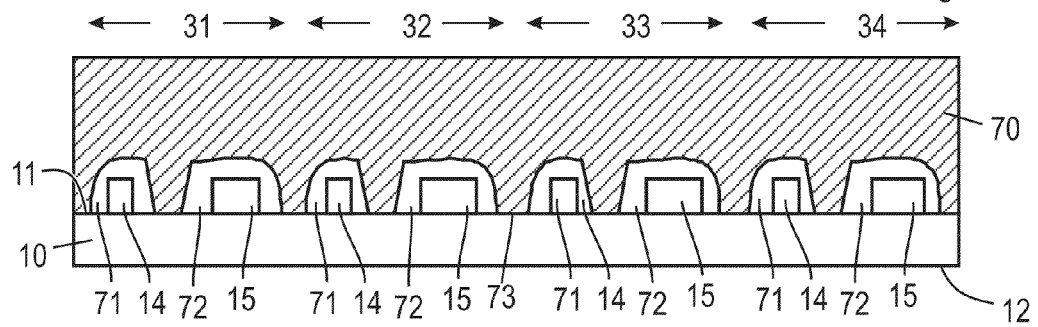
FIGS. 6A to 6C illustrate processes of a method for manufacturing semiconductor devices according to one embodiment.
Figure 6B:
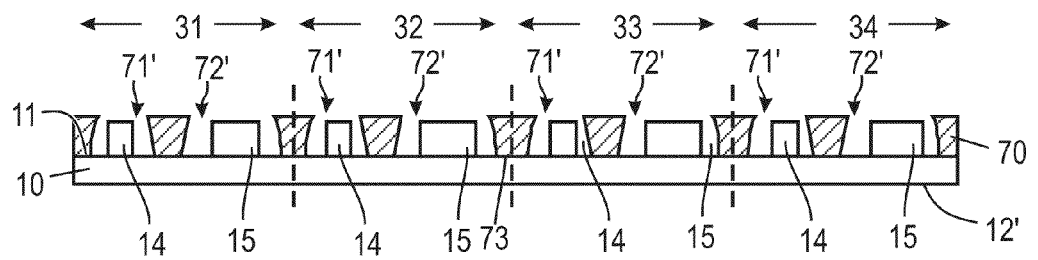
Figure 6C:
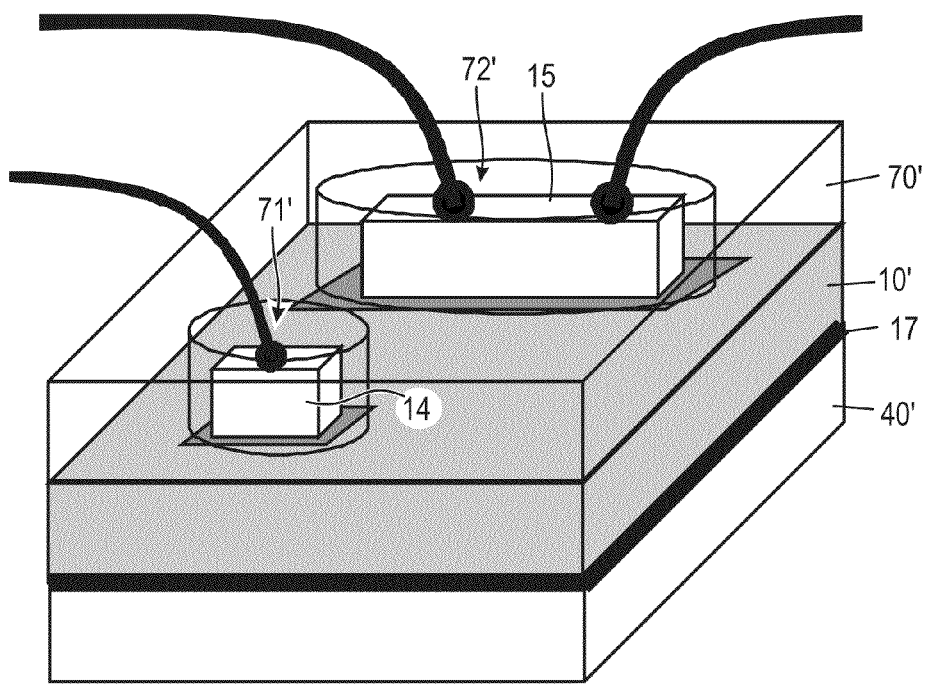

FIGS. 6A to 6C illustrates a further embodiment. Structural features, which are similar to structural features described above, are denoted by the same reference numerals. Furthermore, the description of similar processes is omitted and corresponding references included.

A semiconductor wafer 10 having a first surface 11, a second surface 12, and semiconductor components 31, 32, 33, 34 each including at least two metal pads 14, 15 disposed on the first surface 11 is provided. Each of the semiconductor components 31, 32, 33, 34 also includes at least one doping region, typically a plurality of doping regions.

A glass substrate 70 is provided which includes a plurality of cavities 71, 72 formed at a bonding surface 73 of the glass substrate 70. Each cavity 71, 72 is sized to allow accommodation of only one metal pad 14, 15. Metal pads 14, 15 of each semiconductor component 31, 32, 33, 34 can have a different size, particularly a different lateral extent. Therefore, the respective cavities 71, 72 can also be of different size. In this particular embodiment, cavity 71 is sized to allow accommodation of metal pad 14 and cavity 72 is sized to allow accommodation of metal pad 15. In this embodiment cavity 72 is larger than cavity 71.

The glass substrate 70 is aligned and then bonded by using any suitable bonding process as described above. The resulting structure is illustrated in FIG. 6A. Each metal pad 14, 15 is accommodated and encapsulated by a respective cavity 71, 72 so that adjacent metal pads 14, 15 of the same semiconductor component 31, 32, 33, 34 are insulated from each bother by the glass substrate 70 and particularly by the walls of the glass substrate 70 which are disposed between the adjacent metal pads 14, 15.

In further processes, the semiconductor wafer 10 can be thinned. Furthermore, the glass substrate 70 can be machined to expose the cavities 71, 72 and to form openings 71', 72' to allow access to the metal pads 14, 15 of the semiconductor component 31, 32, 33, 34. The adjacent metal pads 14, 15 remain insulated from each other by the walls of the glass substrate 70 as illustrated in FIG. 6B. In a further process, the semiconductor wafer 10 is diced along the separation lines as described above to form semiconductor devices having a semiconductor chip 10' and a glass chip 70'.

A 3-dimensional illustration of such a semiconductor device is illustrated in FIG. 6C. Metal pads 14 and 15, which form for example the gate pad and the source pad of a power FET, respectively, are insulated from each other the glass substrate 70. Other structural elements can be similar to the elements described above. The semiconductor device can particularly include a further glass substrate or glass chip 40' bonded to the second surface of the semiconductor chip 10'.

Figure 7A:
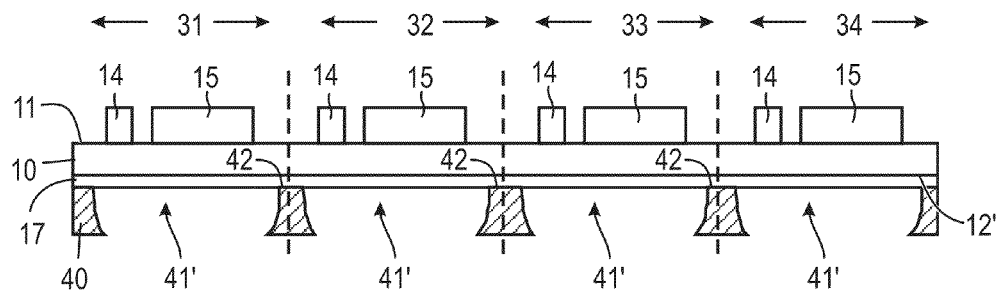
FIGS. 7A to 7B illustrate processes of a method for manufacturing semiconductor devices according to one embodiment.

A further embodiment is described in connection with FIGS. 7A and 7B. Structural features, which are similar to structural features described above, are denoted by the same reference numerals. Furthermore, the description of similar processes is omitted and corresponding references included.

In this embodiment, a semiconductor wafer 10 and a glass substrate 40 bonded to the semiconductor wafer 10 is provided. The glass substrate 40 includes a plurality of openings 41' to expose surface portions of the semiconductor wafer 10. The openings define the size and location of metallisation regions which will be formed later. The glass substrate 40 is bonded with its bonding surface 42 to a second surface 12' of a semiconductor wafer 10. As described above, the bonded glass substrate 40 can include cavities at its bonding surface, which are later exposed by grinding or polishing the bonded glass substrate. In other embodiments, the glass substrate 40 can be bonded with already exposed cavities, i.e. openings. Any suitable bonding process as described above can be used.

Metal pads 14, 15 of a plurality of semiconductor components 31, 32, 33, 34 can be disposed on the first surface 11 of the semiconductor wafer 10. The semiconductor wafer 10 can also includes a plurality of doping regions as described above. Furthermore, a metallic seed layer 17 can be formed on the second surface 12' prior to bonding the glass substrate 40.

Figure 7B:
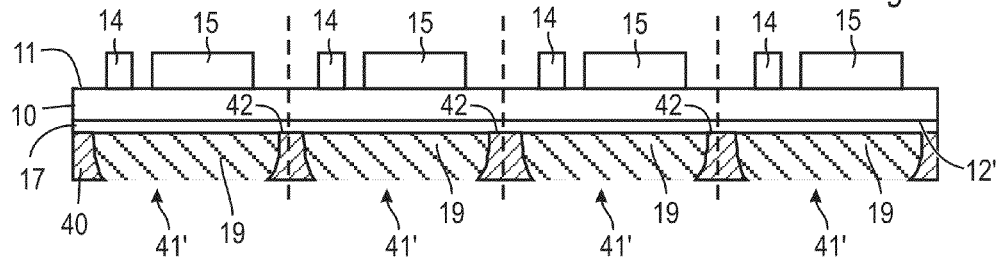

The openings 41' of the glass substrate 40 are filled with a metal or a metal compound to form metallisation regions 19 as illustrated in FIG. 7B. Suitable processes for forming the metallisation regions 19 are, without being limited thereto, plating, printing and pasting. Glass substrate 40 functions as a mask when forming the metallisation regions 19 as described above.

In further processes, the semiconductor wafer 10 is diced along separation lines as described above to obtain separate semiconductor devices.

Figure 8A:
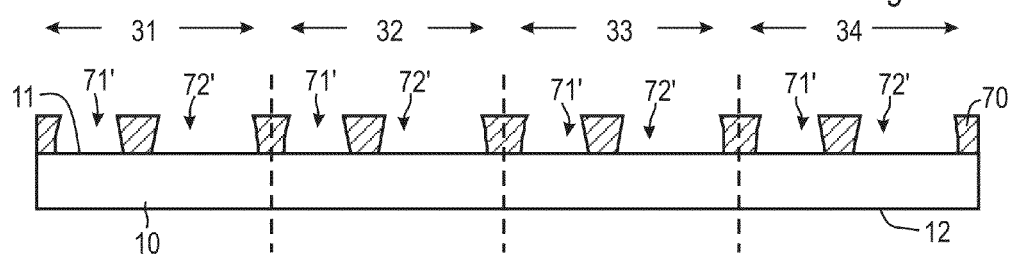
FIGS. 8A to 8B illustrate processes of a method for manufacturing semiconductor devices according to one embodiment.

A further embodiment is described in connection with FIGS. 8A and 8B. Structural features, which are similar to structural features described above, are denoted by the same reference numerals. Furthermore, the description of similar processes is omitted and corresponding references included.

A semiconductor wafer 10, which includes a first surface 11 and a second surface 12, and a glass substrate 70 bonded to the first surface 11 of the semiconductor substrate 10 is provided. The semiconductor wafer 10 includes doping regions to form a plurality of semiconductor components 31, 32, 33, 34. The glass substrate 70 includes a plurality of openings 71', 72' which expose respective portions of the first surface 11 of the semiconductor wafer 10. The openings 71', 72' define the size and location of pad regions which are later formed.

The glass substrate 70 can be bonded to the first surface 11 by any of the above described bonding processes. Typically, a metallic seed layer can be formed on the first surface prior to bonding. When formation of separate pad regions for the same semiconductor component 31, 32, 33, 34 is desired, the metallic seed layer is typically not formed on the entire first surface 11 to avoid a short circuit. Metallic seed layers can be formed within each opening 71', 72' after bonding the glass substrate 70.

The glass substrate 70 can already include the openings 71', 72' when bonded as described above. In one embodiment, the glass substrate 70 can include a plurality of cavities which are exposed by machining the glass substrate after bonding as described above.

Figure 8B:
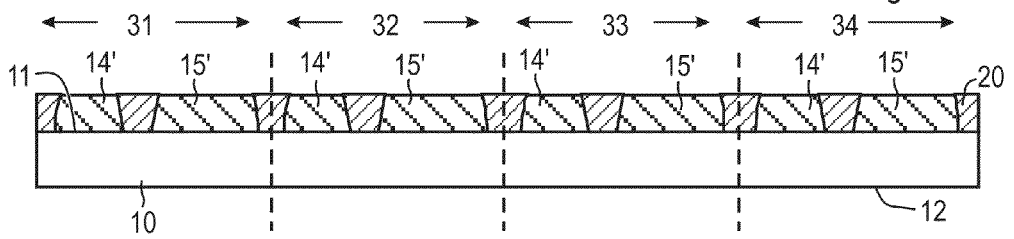

In a further process, the openings 71', 72' are filled with a metal or metal compound such as a metal alloy to provide a plurality of separate metal pad regions 14', 15' as illustrated in FIG. 8B. The metal pad structures 14', 15' can be formed by plating, pasting or printing to obtain thick metal pad structures. Annealing processes may be needed to finish the manufacturing of the metal pad regions 14', 15'. The thick metal pad regions 14', 15' can be used as landing pads for bond wire connections as described above. Due to their thickness, metal pad regions 14', 15' protect the underlying structures from the mechanical stress occurring during bonding. The thickness of the metal pad regions 14', 15' can be defined by the thickness of the glass substrate 70. For example, when a 100 μm thick glass substrate 70 is used, the metal pad regions 14', 15' will have a similar thickness when formed by pasting. It is also possible to form the metal pad regions 14', 15' with other thicknesses.

In further processes, the semiconductor wafer 10 is diced along separation lines as described above to obtain separate semiconductor devices.

The above described embodiments can be combined. For example, the formation of metal pads regions 14', 15' on the first surface 11 of the semiconductor wafer 10 as illustrated in FIGS. 8A and 8B can be combined with the formation of metallisation regions 19 on the second surface 12' of the semiconductor wafer 10 as illustrated in FIGS. 7A and 7B. Furthermore, the semiconductor wafer 10 can be thinned after bonding the glass substrate to the first surface 11 as described above.

Figure 9A:
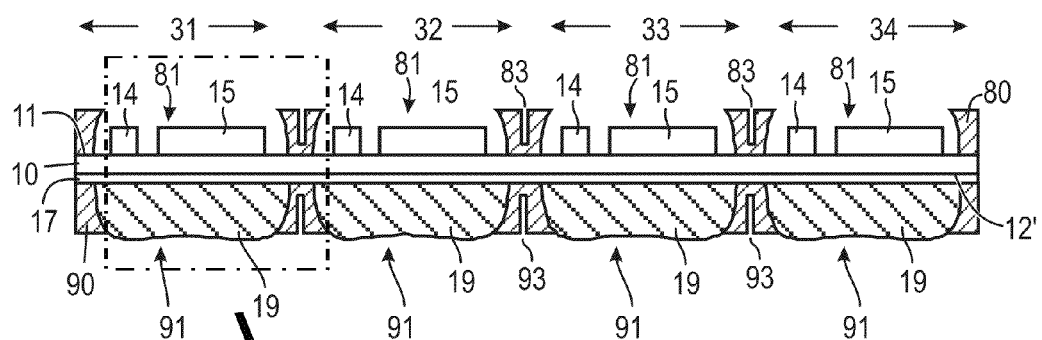
FIGS. 9A to 9C illustrate processes of a method for manufacturing semiconductor devices according to one embodiment.
Figure 9B:
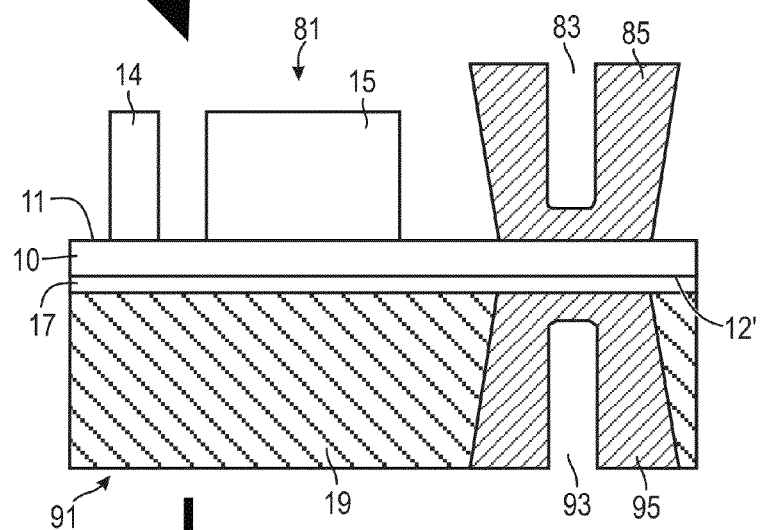
Figure 9C:
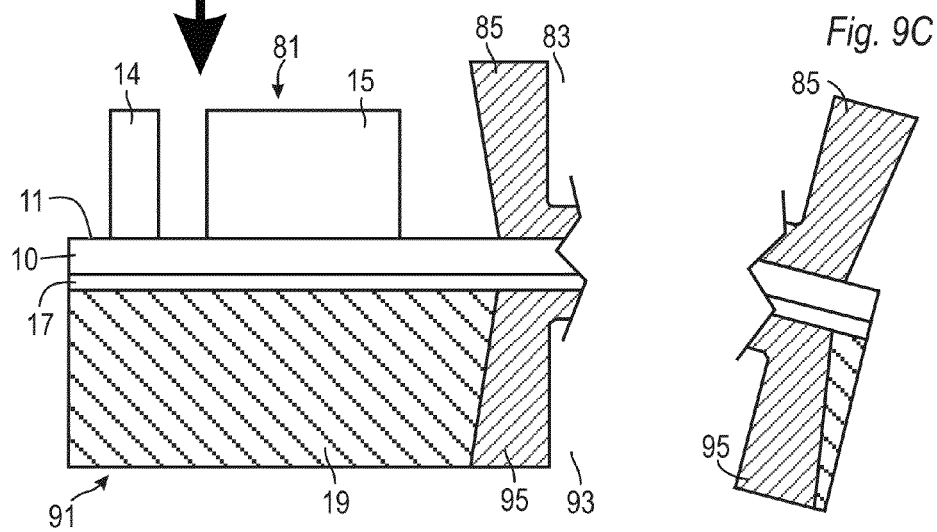

A further embodiment is described in connection with FIGS. 9A to 9C. Structural features, which are similar to structural features described above, are denoted by the same reference numerals. Furthermore, the description of similar processes is omitted and corresponding references included.

This embodiment particularly illustrates options to facilitate separation of the semiconductor components to form separate semiconductor devices. As illustrated in FIG. 9A a semiconductor wafer 10 is provided having a first surface 11 and a second surface 12'. At least one glass substrate is provided, for example on the first surface 11. In one embodiment, a glass substrate is provided on the second surface 12'. It is also possible to provide a first glass substrate 80 on the first surface 11 and a second glass substrate 90 on the second surface 12'.

Trenches 83 are formed in one or both of the first and second glass substrates 80, 90 along pre-defined break lines. FIG. 9A illustrates that trenches 83 are formed in the first glass substrate 80 while trenches 93 are formed in the second glass substrate 90. Trenches 83 and 93 are substantially aligned with each other.

The trenches 83, 93 can be formed prior to bonding the glass substrate 80, 90 or after bonding the glass substrate 80, 90 to the respective surfaces 11, 12. The depth of the trenches 83, 93 can be, for example, equal to at least half of the thickness of the respective glass substrates 80, 90 or even more than that. Forming the trenches 83, 93 after bonding allows formation of deep trenches since otherwise the glass substrates would become mechanically very fragile. The trenches 83, 93 can be formed, for example, by sawing or by any other suitable process.

The semiconductor wafer 10 can include, as described above, a plurality of semiconductor components 31, 32, 33, 34 each of which can include at least one metal pad 14, 15 arranged on the first surface 11. The metal pads 14, 15 of the respective semiconductor components are accommodated within the openings 81 of the first glass substrate 80.

On the second surface 12', metallisation region 19 can be formed as described above.

In a further process, the semiconductor wafer 10 and the glass substrates 80, 90 are separated into dies by breaking along the trenches 83, 93. This is illustrated in FIGS. 9B and 9C which illustrates an enlarged detail from FIG. 9A indicated by dashed-dotted lines. The trenches 83, 93 facilitates breaking since the total material strength of the semiconductor wafer 10 and the first and second glass substrates 80, 90 is significantly reduced along the trenches 83, 93. It should be noted that openings 81 and 91 are laterally surrounded by walls 85, 95 of the respective glass substrates as illustrated in the 3-dimensional illustrations illustrated in FIGS. 2G and 6C. Hence, these openings 81, 91 do not provide breaking lines. Trenches 83, 93 therefore form rated break lines.

The above described separation process can be referred to as "scribe-and-break". Again, separation takes place through material of similar mechanical properties and not through thick metallisation regions formed at the second surface 12'. This avoids difficulties associated with commonly known separation processes which separate semiconductor devices by cutting through brittle semiconductor wafer and thick ductile metal layers. Since the above described embodiments cut mainly through material of similar mechanical properties, the cutting process can be better adapted to the material properties.

The embodiment described in connection with FIGS. 9A to 9C can be combined with any other of the above described embodiments. For example, it is possible to bond glass substrate having cavities and then machining the glass substrates to expose the cavities. Furthermore, metallisation regions can be formed on the second surface and/or on the first surface as described above by using the respective glass substrates as mask. Moreover, the semiconductor wafer can be thinned as described above.

An irreversible carrier system is described above where one or two structured glass substrates are bonded to a semiconductor wafer to support mechanically the semiconductor either on the first or on the second surface or on both surfaces. The glass substrate or substrates remain part of the device even after dicing and can serve as passivation. Furthermore, the structured glass substrate can serve as a mask to form separated and spaced-apart metallisation region so that no cutting through the metallisation regions is needed for dicing. The glass substrates can be structured such that they allow accommodation of metal pads, for example on the first surface. Furthermore, the glass substrates can be structured such that they can be used as mask to form metallisation regions, for example on the first and/or the second surface.

The thickness of the metallisation regions, either on the first surface or on the second surface or on both surfaces can be different and selected according to specific needs. The carrier system described herein allows handling of very thin semiconductor wafers.

A semiconductor wafer supported on a single side by a glass substrate can be thinned to a desired target thickness. Subsequently, a further structured glass substrate can be bonded to the side on which the semiconductor wafer was thinned to obtain a double-side supported semiconductor wafer. The further glass substrate, when structured, can be used to form separate and spaced apart metallisation regions of various thicknesses.

It is to be understood that the features of the various example embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   at least two terminals;
   a semiconductor substrate comprising a first surface and a second surface, the semiconductor substrate comprising at least one doping region and a metal pad, which is arranged on the first surface;
   a first glass substrate comprising at least one opening, the first glass substrate is bonded to the first surface of the semiconductor substrate such that the metal pad is arranged in the opening of the first glass substrate;
   a second glass substrate comprising at least one opening, the second glass substrate is bonded to the second surface of the semiconductor substrate;
   at least one metallisation region on the second surface of the semiconductor substrate, the metallisation region filling the opening of the second glass substrate.

2. The semiconductor device of claim 1, wherein the first glass substrate, the second glass substrate and the semiconductor substrate forming a common lateral surface.

3. The semiconductor device of claim 1, further comprising a carrier substrate comprising at least one bonding pad and a bond wire connection which electrically connects the metal pad on the first surface of the semiconductor substrate with the bonding pad of the carrier substrate.

* * * * *